United States Patent [19]
Kapoor

[11] Patent Number: 5,763,302
[45] Date of Patent: Jun. 9, 1998

[54] SELF-ALIGNED TWIN WELL PROCESS

[75] Inventor: Ashok K. Kapoor, Palo Alto, Calif.

[73] Assignee: LSI Logic Corporation, Milipitas, Calif.

[21] Appl. No.: 704,472

[22] Filed: Aug. 20, 1996

Related U.S. Application Data

[63] Continuation-in-part of Ser. No. 488,075, Jun. 7, 1995, Pat. No. 5,583,062.

[51] Int. Cl.$^6$ ............................................. H01L 21/8238
[52] U.S. Cl. ............................................. 438/199; 438/933
[58] Field of Search .................................... 257/371, 351, 257/274; 438/199, 933

[56] References Cited

U.S. PATENT DOCUMENTS

| | | | |
|---|---|---|---|
| 3,879,619 | 4/1975 | Pleshko | 307/251 |
| 4,373,253 | 2/1983 | Khadder et al. | 29/576 B |
| 4,523,111 | 6/1985 | Baliga | 307/574 |
| 4,527,325 | 7/1985 | Geipel et al. | 29/571 |
| 4,558,508 | 12/1985 | Kinney | 29/571 |
| 4,568,842 | 2/1986 | Koike | 307/279 |
| 4,654,548 | 3/1987 | Tanizawa et al. | 307/450 |
| 4,786,958 | 11/1988 | Bhagat | 357/38 |
| 4,816,705 | 3/1989 | Ohba et al. | 307/446 |
| 4,947,064 | 8/1990 | Kim et al. | 307/594 |
| 5,132,241 | 7/1992 | Su | 437/70 |
| 5,160,855 | 11/1992 | Dobberpahl | 307/270 |
| 5,216,294 | 6/1993 | Ryu | 307/443 |
| 5,252,501 | 10/1993 | Moslehi | 437/34 |
| 5,266,849 | 11/1993 | Kitahara et al. | 307/475 |
| 5,324,683 | 6/1994 | Fitch et al. | 437/65 |

Primary Examiner—John Niebling
Assistant Examiner—Long Pham
Attorney, Agent, or Firm—Marger Johnson McCollom & Stolowitz, P.C.

[57] ABSTRACT

A method is provided for forming planar, self-aligned spaced-apart wells without a high temperature oxidation step to form an ion barrier. The method comprises preparing a substrate with a silicon dioxide-polysilicon-silicon dioxide barrier layer that can be etched to expose different sublayers of the barrier at selected junctures in the production process. A single masking step defines the location of a first set of wells on the prepared substrate. The outer silicon dioxide layer is etched to expose the polysilicon layer at the selected locations, and the substrate is implanted to form the first set of wells. Following ion implantation, the substrate photoresist is removed, and the substrate is exposed to a germanium-silicon mixture under conditions selected to preferentially deposit a germanium-silicon alloy barrier layer on the exposed polysilicon layer. The germanium-silicon alloy masks the first set of doped wells against subsequent etching and an ion implantation step that forms the second set of doped wells. Since the locations at which the germanium-silicon alloy deposits are defined by the locations of the first set of wells, the second set of wells is automatically aligned with respect to the first set of wells, and about 500 Å, thick.

25 Claims, 5 Drawing Sheets

SELF-ALIGNED TWIN WELL PROCESS

RELATED APPLICATION

This is a continuation-in-part application of U.S. Ser. No. 08/488,075, filed Jun. 7, 1995, now U.S. Pat. No. 5,583,062.

BACKGROUND OF THE INVENTION

This invention relates to the field of methods for processing semiconductor materials, and in particular to methods for forming self-aligned wells of P and N type semiconductor materials using a single photo-resist masking step.

Many semiconductor fabrication process employ steps that produce self-aligned wells in which dopant wells having complementary conductivity properties are placed adjacent to each other. For example, the N and P tubs of CMOS devices are often fabricated using a process that produces self aligned wells. The adjacent wells produced by these processes reduce the amount of semiconductor "real estate" occupied by the corresponding device. In addition, the use of self-aligned well processes eliminates the need to mask the semiconductor wafer with a photo-resist for each ion implantation step.

In place of a second photo-resist mask, conventional self-aligned processes employ a thick oxide layer to mask the semiconductor wafer for ion implantation of the second well. Growth of the thick oxide layer requires elevated temperatures which cause unwanted diffusion of implanted species in the semiconductor wafer. In addition, the thick oxide layers disrupt the planarity of the semiconductor wafer.

There is thus a need for low temperature methods for producing self aligned, spaced apart wells in a semiconductor material without disrupting the planarity of the semiconductor material.

SUMMARY OF THE INVENTION

The present invention is a method for forming self-aligned, spaced apart doped wells without the need for additional high temperature, oxide generating steps. The present invention employs a barrier layer having a silicon dioxide-polysilicon-silicon dioxide multi-layer structure formed over a semiconductor substrate. Locations of the first set of wells are defined with a photo-resist, and the outer silicon dioxide layer of the multilayer barrier is removed at the selected locations to expose the polysilicon layer. The semiconductor wafer is then implanted with dopant ions to form a set of wells having a first conductivity type at the selected locations. In the preferred embodiment, boron ions are used to implant the first set of wells since they easily penetrate the remaining polysilicon/silicon-dioxide layers of the multi-layer barrier.

Following ion implantation, the photo-resist is removed and the semiconductor wafer is subjected to a chemical vapor deposition (CVD) step with a mixture of germanium and silicon compounds. The CVD conditions are selected to grow a germanium-silicon alloy preferentially on the exposed polysilicon layer over the first set of wells. Substantially no germanium-silicon alloy grows on the exposed silicon dioxide surface, while the germanium-silicon alloy deposited on the polysilicon layer acts as a mask for a subsequent ion-implantation step. The multi-layer barrier is then selected etched to remove two or more layers of the unmasked barrier.

Then, spacer sidewalls of a selected thickness are formed on the inner sidewalls of the germanium-silicon alloy layer. Ion-implantation with a second type of ion then forms a second set of doped wells adjacent to the areas masked by the germanium-silicon alloy. Since the first and second wells are defined by the boundary of the photo-resist mask, the wells are formed in a self aligned manner but a selected spacing from each other. More specifically, wells having a second conductivity type are formed at the etched locations spaced apart at a distance from the wells having a first conductivity type so that the distance therebetween is substantially equal to the thickness of the spacer sidewall. The method is advantageous in that a carefully controlled, self-aligned spacing is produced between the wells, and capacitive coupling between the wells is thereby reduced to a selected level depending on the thickness of the sidewall spacer. In addition, since oxide layers are not used to mask the substrate against ion implantation, additional high temperature oxide growth steps are eliminated from the process.

In a preferred process of the present invention, after etching the outer silicon dioxide and polysilicon layers of the barrier layer, an outer layer of spacer material is deposited in a selected thickness onto the inner sidewall and the exposed horizontal surface of the germanium-silicon alloy layer. After deposition is completed, the outer layer of spacer material on the exposed horizontal surface of the deposited germanium-silicon alloy layer are etched thereby forming said spacer sidewall of a selected thickness on said inner sidewalls of said germanium-silicon alloy layer.

In another form of the invention, the spacer sidewalls are masked to define a set of selected locations. In this way, wells having first and second conductivity types will be spaced apart at a selected distance from each other. Prior to forming the wells having a second conductivity type, the spacer sidewalls which have not been masked are etched leaving intact the masked spacer sidewalls. Thereafter, the masking is removed from the masked spacer sidewalls. At this point, wells having a second conductivity type are formed adjacent the spacer sidewall locations spaced apart at a distance from said wells having a first conductivity type. As before, the distance between the wells is substantially equal to the thickness of said spacer sidewall. In this version of the present invention, spacing between the wells is only introduced where needed to prevent capacitive coupling (for example in portions of the wafer where PLL is to be formed), but not in the remainder of the wafer, to achieve closely spaced wells. These sidewall spacers may be selectively formed by a photolithographic method.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1A:
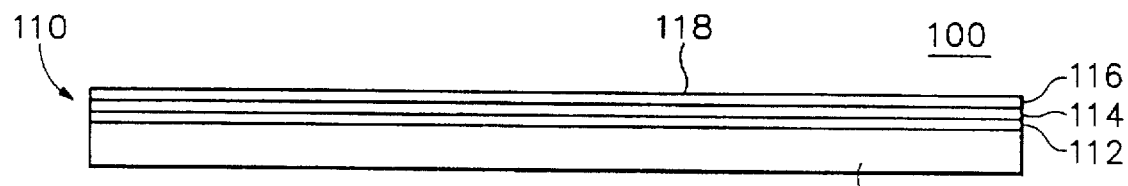
FIGS. 1A–1N, and 1P–1Q are cross sections of a semiconductor substrate in various stages of processing in accordance with the present invention.

Referring to FIG. 1A there is shown a semiconductor wafer 100 comprising a substrate 102 and a barrier-layer 110 in accordance with the present invention. Barrier layer 110 is a multi-layer structure comprising a first silicon dioxide layer 112, a polysilicon layer 114, and a second silicon dioxide layer 116. Initially, silicon dioxide layer 116 forms an upper surface 118 for semiconductor wafer 100. Barrier layer 110 protects substrate 102 and the multi-layered structure of barrier layer 110 allows different materials to be exposed by selective etching, as described in greater detail below.

The thickness of silicon dioxide layers 112, 116 and polysilicon layer 114 are selected to allow doping of substrate 102 to proceed through various modifications of barrier layer 110. Typically, first silicon dioxide layer 112 is between 100Å and 1000 Å thick, second silicon dioxide layer 116 is between 100 Å and 1000Å thick, and polysilicon layer 114 is between 50Å and 500Å thick. In the Preferred embodiment of the invention, the total thickness of barrier layer 110 is between 250Å and 2500Å thick.

Silicon dioxide layers 112, 116 may be formed by a variety of processes, including low pressure chemical vapor deposition (LPCVD) of silicon dioxide and oxidation of substrate 102 and polysilicon layer 114. LPCVD processes suitable for generating silicon dioxide layers 112, 116 are, for example, the reaction of silane with oxygen at 200° C. to 450° C. and the reaction of dichlorosilane with nitrous oxide at approximately 900° C. In the preferred embodiment, silicon dioxide layer 112 is grown by thermal oxidation (wet) of substrate 102 at 900° C. to 1000° C. and, silicon dioxide layer 116 is deposited by CVD.

Polysilicon layer 114 may also be formed by LPCVD. For example, the reaction of silane with hydrogen at approximately 600° C. to 650° C. and a pressure of between 25 and 150 Pa produces suitable polysilicon films for multilayer barrier 100.

Figure 1B:
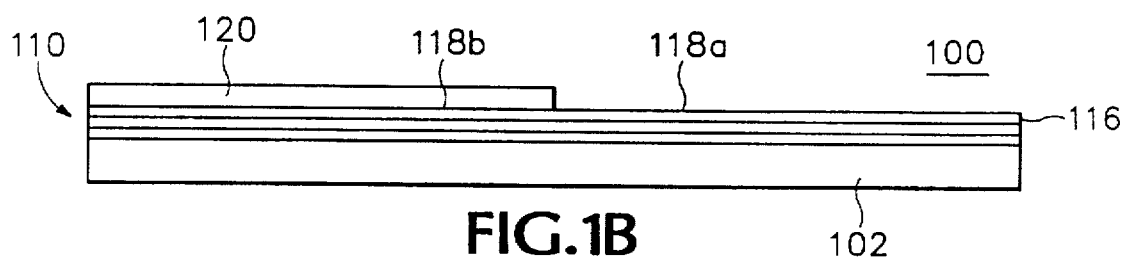

Once barrier 110 has been formed over substrate 102, semiconductor wafer 100 is masked for deposition of a set of wells of one conductivity type. Referring now to FIG. 1B, there is shown semiconductor wafer 100 following deposition of a photo-resist mask 120. For clarity, surface 118 of semiconductor wafer 100 has been designated as exposed surface 118a and masked surface 118b. Photo-resist 120 is deposited as a thin film, developed, and etched by any of a variety of well know methods. The thickness of photo-resistant 120 is selected to mask the underlying areas of semiconductor wafer 100 against Ion implantation. Typical thickness for photo-resist mask 120 is between 1μm and 2μm.

Figure 1C:
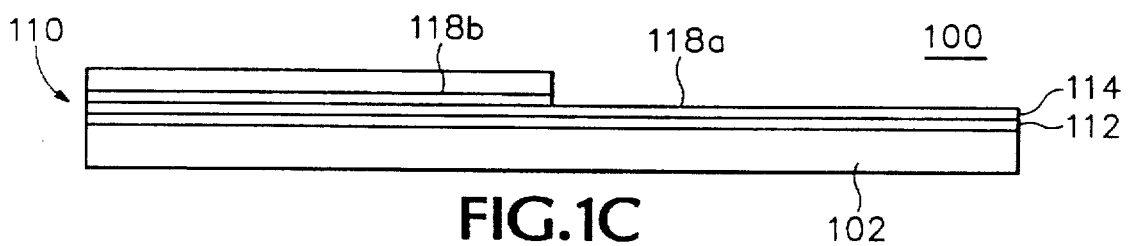

Prior to forming a first set of wells by ion implantation, oxide layer 116 of exposed surface 118a is etched. Referring now to FIG. 1C, there is shown a cross-section of semiconductor wafer 100 and photo-resist 120 following an etch step to remove the exposed portion of second silicon dioxide layer 116. Second silicon dioxide layer 116 may be chemically etched by, for example, a hydrofluoric acid containing etch, or it may be dry etched by plasma, sputter, or reactive ion etching techniques. Following this etch step, polysilicon 114 forms exposed surface 118a of semiconductor wafer 100. Photo-resist mask 120 insures that exposed surface 118a of polysilicon layer 114 is aligned with doped well 122.

Figure 1D:
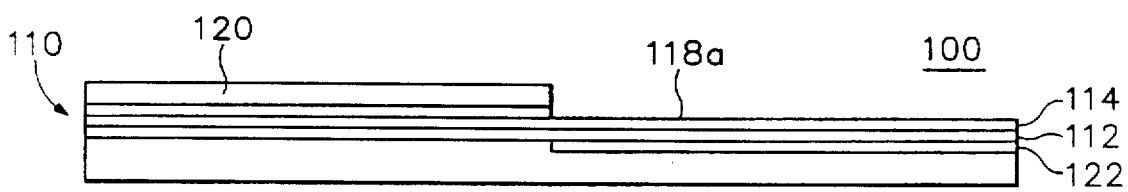

Referring now to FIG. 1D, there is shown a cross-section of semiconductor wafer 100 following ion implantation to form a doped well 122. In the preferred embodiment of the present invention, doped well 122 is a p-well formed by ion implantation of boron. Under selected implantation conditions, the lighter boron ions pass readily through polysilicon layer 114 and silicon dioxide layer 116. In the disclosed embodiment, the ions are deposited at energies of between about 100 and about 1000 keV at fluxes of between $1 \times 10^{11}$ cm$^{-2}$ and about $1 \times 10^{13}$ cm$^{-2}$. It is understood that the cross-sections of FIGS. 1A–1I represent only one region of semiconductor wafer 100, and that multiple wells 122 can be formed on semiconductor 100, simultaneously.

Figure 1E:
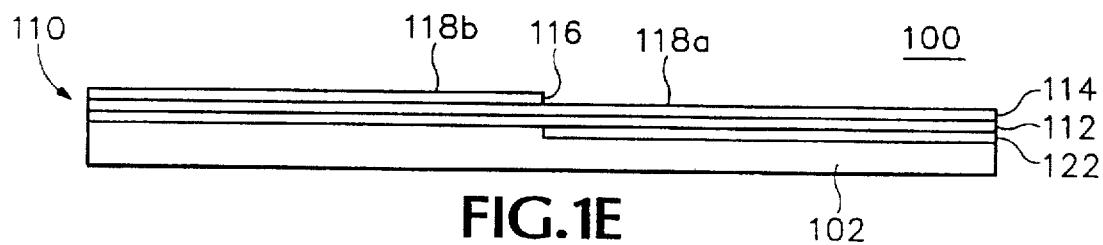

In preparation for forming a second set of doped well, photo-resist mask 120 is etched from semiconductor wafer 100. Referring now to FIG. 1E, there is shown a cross-section of semiconductor wafer 100 following removal of photo-resist mask 120. Photo-resist mask 120 may be removed by means of chemical solvents appropriate for the photo-resist material or by etching the photo-resist material in an oxygen plasma. FIG. 1E reveals semiconductor wafer 100 having exposed surface 118a formed by silicon dioxide layer 116 over undoped regions of substrate 102.

In conventional self aligned well processes, following removal of photo-resist mask 120, a thick oxide layer is deposited over the first implanted well. As noted above, this requires a high temperature oxidation step, and the thickness of the resulting oxide layer disrupts the planarity the semiconductor wafer. The present invention uses the multi-layer structure of barrier layer 110 to alter exposed surface 118a of FIGS. 1B, 1C, 1D and preferentially deposit a non-oxide ion barrier over doped well 122. The method utilizes the different chemical and physical properties of polysilicon layer 114 and second silicon dioxide layer 116 in combination with selected deposition conditions to preferentially grow a germanium-silicon ion implantation barrier over polysilicon layer 114.

A Ge-containing alloy may be formed on semiconductor wafer 100 by a variety of methods. In the preferred embodiment, a germanium-silicon alloy is preferentially grown over polysilicon layer 114 using a CVD process in which a mixture of GeH$_4$ and SiH$_4$ are reacted in the presence of HCl at a substrate temperature of between about 500° C. and about 1000 ° C. The Ge:Si ratio in the deposited germanium-silicon alloy is generally between 20:80 and 50:50, although it may be 100% germanium. In the preferred embodiment, the Ge-containing layer is 30:70 Ge:Si and is deposited to a thickness of between 0.4 and 1μ approximately.

Figure 1F:
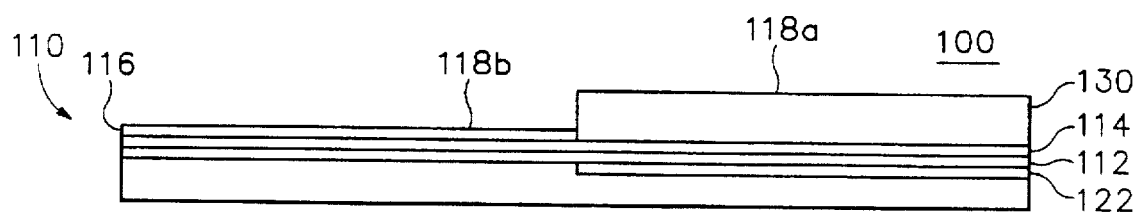

Referring now to FIG. 1F, there is shown semiconductor wafer 100 following exposure to a germanium-silicon mixture to produce a Ge—Si alloy layer 130. Under the disclosed conditions, Ge—Si alloy layer 130 does not deposit significantly on second silicon dioxide layer 116 and so preferentially forms on exposed polysilicon layer 114a over doped wells 122. Ge—Si alloy layer 130 acts as a mask during a subsequent ion implantation step and prevents doping ions from entering substrate 102 in the area of doped well 122. Thus, use of Ge—Si layer 130 eliminates the need for oxide layers and the accompanying high temperature oxide growth steps required to produce oxides.

Following deposition of Ge—Si alloy layer 130, oxide layer 116 and, usually, polysilicon layer 114 are etched from semiconductor wafer 100 in preparation for implanting doped wells of complementary conductivity type. For lighter, faster ions such a boron, polysilicon layer 114 need not be removed. However, boron ions are typically deposited in the first ion implantation step, and the heavier phosphorous or arsenic ions deposited in the second step will not penetrate polysilicon layer 114 and silicon dioxide layer 112 effectively. Consequently, the preferred embodiment of the present invention removes oxide layer 116 and polysilicon layer 114, and then is typically done by plasma etching.

Figure 1G:
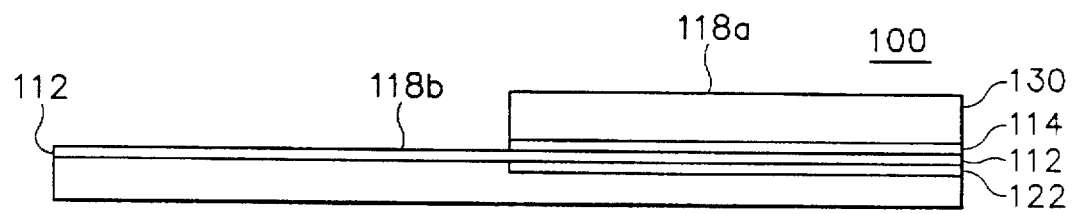

Referring now to FIG. 1G, there is shown a cross-section of semiconductor wafer 100 following the plasma etch step, where exposed surface 118b is formed by first SiO$_2$ layer 112. A subsequent ion implantation step forms the second set of complementary wells beneath exposed SiO$_2$ layer 112.

Figure 1H:
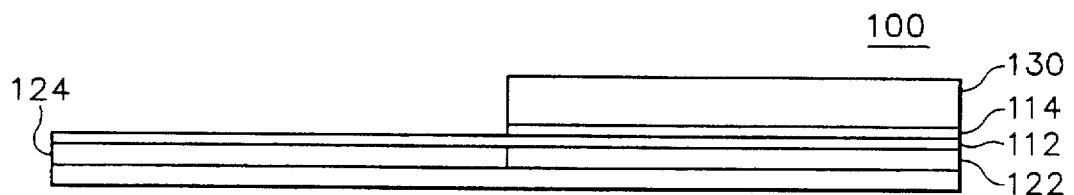
Figure 1I:
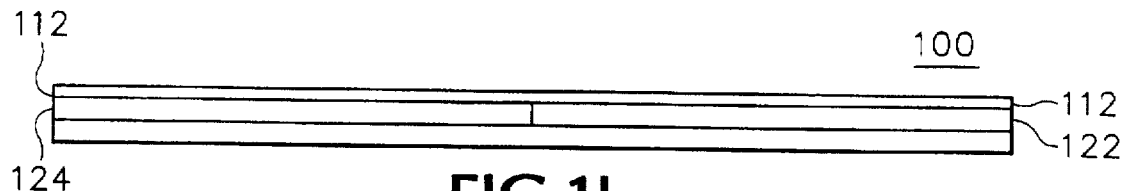

Referring now to FIG. 1H, there is shown a cross-section of semiconductor wafer 100 following a second ion implantation step to form doped well 124. As in the first ion implantation step, the ions are deposited at energies of between about 100 and about 1000 keV at fluxes of between about $1\times10^{11}$ cm$^{-2}$ and about $1\times10^{13}$ cm$^{-2}$. Because the edges of doped wells 122, 124 are both determined by the location of original photo-resist 120, doped wells 122, 124 are self-aligned. Semiconductor wafer 100 can be prepared for further processing by etching Ge—Si alloy layer 130, remaining polysilicon layer 114, and, if desired, first SiO$_2$ layer 112, as shown in FIG. 1I. However, first silicon dioxide layer 112 provides a protective layer for wafer 100 and is usually left in place until it is necessary to remove it.

FIGS. 1A–1I depict the formation of complementary self aligned doped wells in a semiconductor device. These doped wells 122, 124 are not spaced apart.

Referring now to FIGS. 1J–1M, a preferred method is shown for forming self-aligned, spaced apart doped wells 122, 124A in a semiconductor structure 10A. In one embodiment of the present invention, semiconductor structure 100A, all of the self-aligned doped wells 122 and 124A are spaced apart. In another embodiment of this invention, semiconductor structure 100B, selected self-aligned doped wells 122, 124B are spaced apart.

Figure 1J:
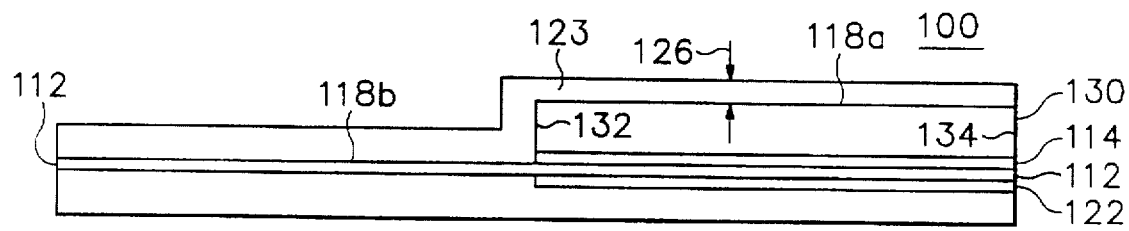

Referring to FIG. 1J, spaced apart wells 122, 124A can be formed by first depositing an outer layer 123 of space material of a selected thickness 126 onto inner sidewall 132, and exposed surfaces 118$a$ and 118$b$, respectively. Typically, outer layer 123 can be formed, but is not restricted to, commercially-available method such as the chemical vapor deposition employing as spacer materials, for example, silicon dioxide (preferred), silicon nitride, or silicon oxynitride. This spacer layer may also be thermally grown silicon dioxide, or it may include an initial layer of thermal oxide. A wide variety of thicknesses can be employed for outer layer 123.

Figure 1K:
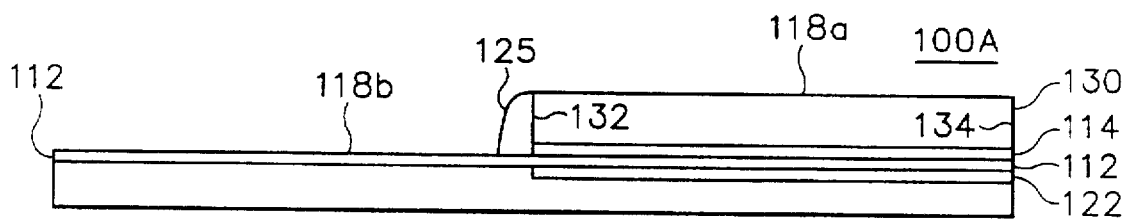

Referring to FIG. 1K, outer layer 123 is etched backed, typically by anisotropic techniques, using a commercially available method such as by reactive ion etching. This etch back step exposes substrate surfaces 118$a$ and 118$b$, while at same time leaving a spacer sidewall 125 remaining on inner sidewall 132.

Figure 1L:
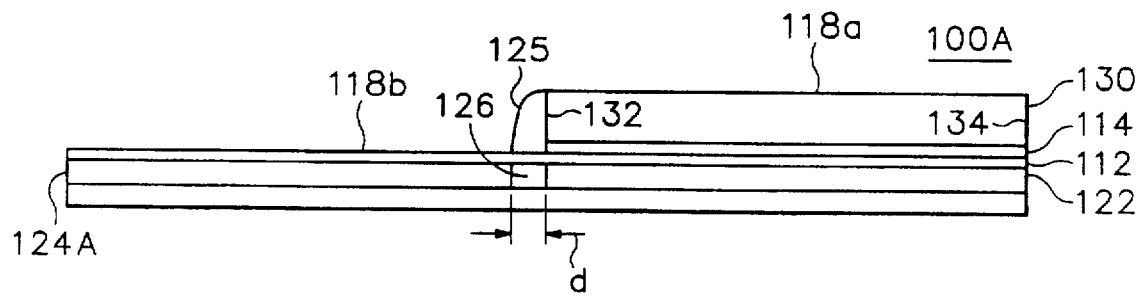

Next, as depicted in FIG. 1L, a cross-section of semiconductor wafer 100A is provided following a second ion implantation step to formed doped well 124A in a similar manner an similar energies and fluxes to doped well 124 (See FIG. 1H). Because the location of spaced apart edges of doped wells 122, 124A are determined by the location of original photo-resist 120 and sidewall spacer 125, doped wells 122, 124A are self-aligned. More specifically, doped wells 122 and 124$a$ are spaced apart a distance "d".

Figure 1M:
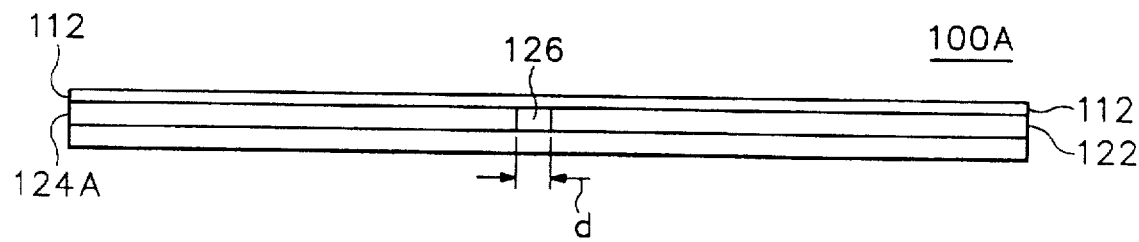

As previously described regarding FIG. 1I, semiconductor wafer 100A can be prepared for further processing by etching back Ge—Si alloy layer 130 and space sidewall 125 retaining polysilicon layer 114, and, if desired, first S$_i$O$_2$ layer 112, as shown in FIG. 1M. For example space sidewall 125 can be etched back using isotropic or plasma etching techniques. As previously stated, first silicon dioxide layer 112 provides a protective layer for wafer 100A and is usually left in place until it is necessary to remove it.

Figure 1N:
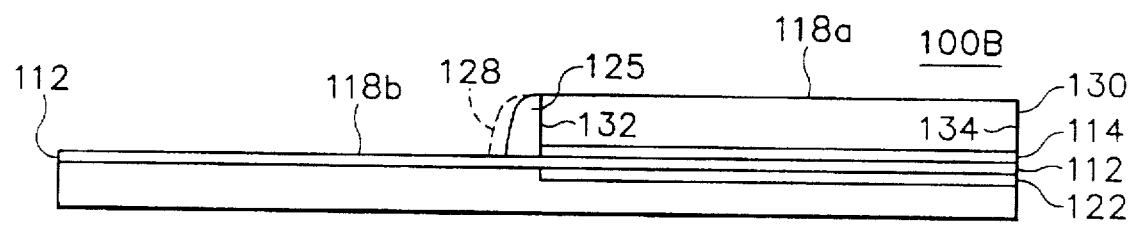
Figure 1P:
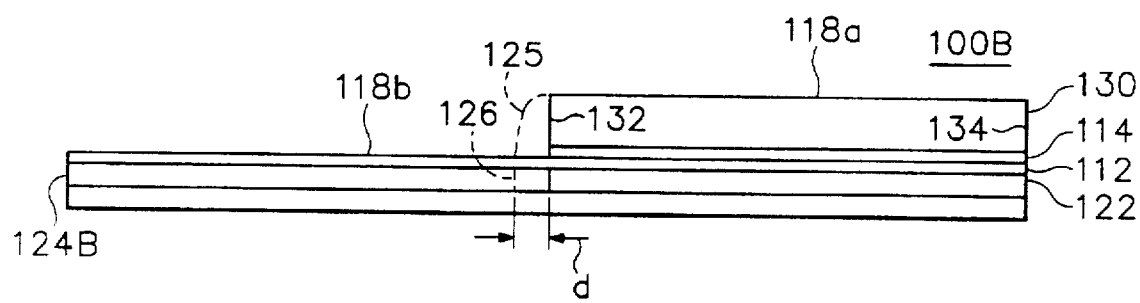
Figure 1Q:
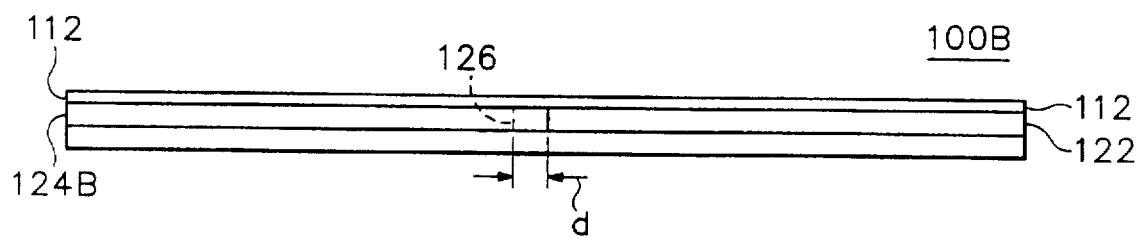
Figure 2:
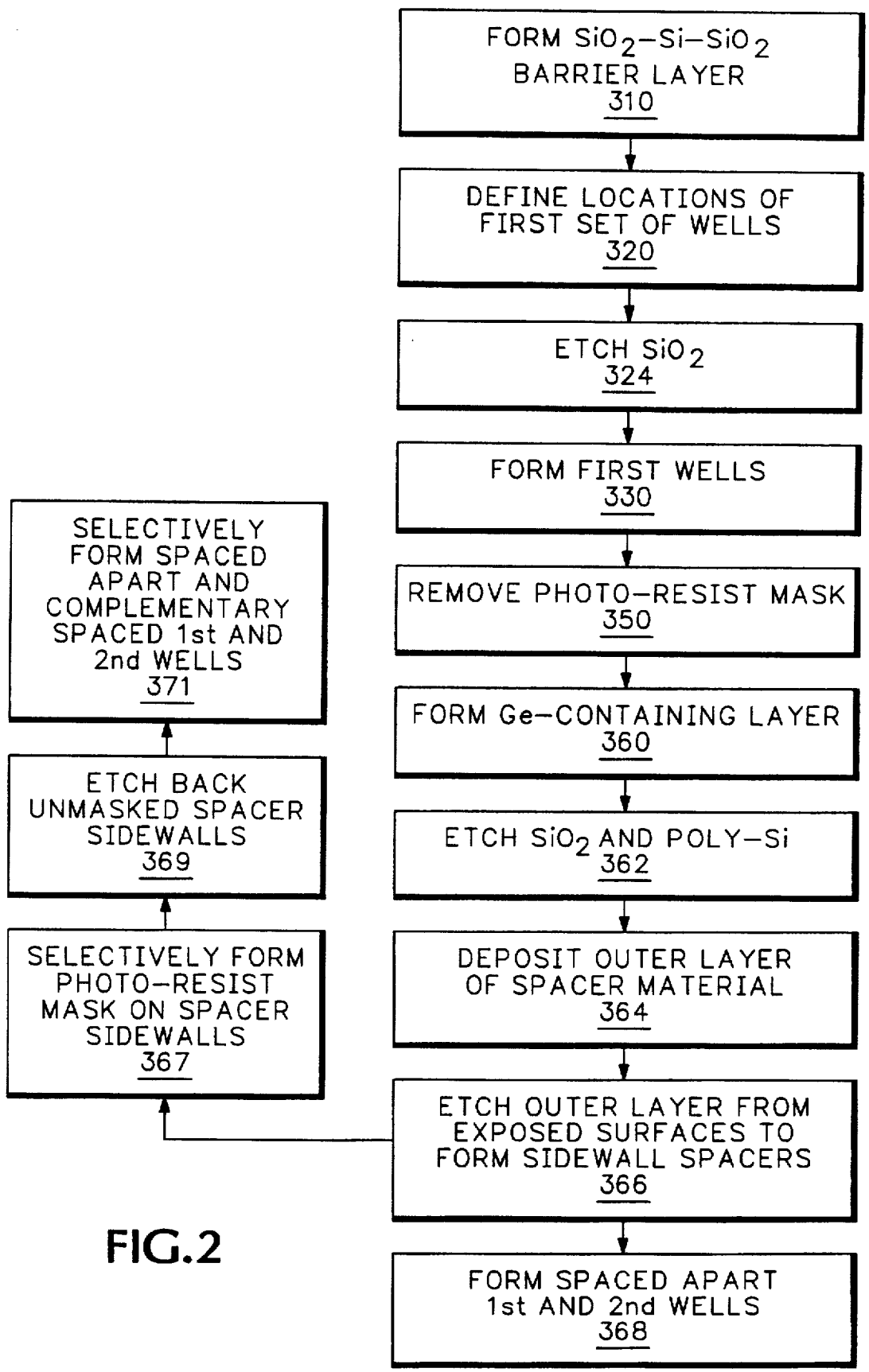
FIG. 2 is a flow chart representing the states of the process shown in FIGS. 1A–1N, and 1P–1Q.

FIGS. 1N, 1P and 1Q relate to the formation of wafer 100B comprising selected self-aligned,spaced apart doped wells 122, 124B. In FIG. 1N, a selected portion of spacer 65 sidewalls 125 are masked by selectively depositing photoresist 128 as a film. This selectively deposited film is developed, and then etched by any of a variety of well known methods, such as isotropic or plasma techniques for example. The thickness of the photo-resist 128, if employed, is selected to mask the sidewall spacer 125 against etching back techniques such as isotropic or plasma etching. Then, the selected sidewall spacers 125 which are not protected by photo-resist material 120 are removed by etching leaving the requisite selected pattern. As shown in FIGS. 1P, selected doped wells 124A are formed in the areas where the sidewall spacers 125 remain and doped wells 124 are formed in the areas where the sidewall spacer 125 have been removed. When the Ge—Si alloy layer 130 or Ge—Si alloy layer 130 and spacer sidewall 125 are etched back, as depicted in FIG. 1Q, first and second doped wells 122 and 124 or first and second doped wells 122A and 124A are selectively produced through wafer 100B.

Referring now to FIG. 3, there is shown a flow chart summarizing the method of the present invention for producing self-aligned wells. A multilayer silicon dioxide-polysilicon-silicon dioxide barrier 110 is formed 310 on substrate 102 and masked 320 with a photo-resist layer 120 to define the locations of a first set of wells 122. Exposed silicon dioxide layer 116 is etched 324 to remove second SiO$_2$ layer 116 and expose polysilicon layer 114 at the selected locations. Dopant ions for wells 122 are then implanted 330 using standard ion implantation techniques, and photo-resist mask 120 is removed 350. Semiconductor wafer 100 is then exposed 360 to a Ge—Si mixture under conditions selected to form a Ge—Si alloy layer 130 preferentially over exposed polysilicon layer 114. Second SiO$_2$ layer 116 and polysilicon layer 114 exposed by removal of mask layer 120 are then etched 362. Before dopant ions for second wells 124 are implanted 370 through the exposed portion of first SiO$_2$ layer 112, an outer layer 124 of space material is deposited 364 onto exposed surfaces 118$a$ and 118$b$ and sidewall 132. Next, the outer layer 124 is etched 366 from the exposed surfaces 118$a$ and 118$b$ to form sidewall spacers 125.

At this point several scenarios can be implemented. A first scenario is the direct formation 368 of spaced apart (at a spacing 126) first and second well 122 and 124A. A second scenario contemplates photo-resist formation 367 on selected spacer sidewalls 125 followed by etching back 369 the unmasked spacer sidewalls. In this way, spaced apart and complementary spacer first and second wells 122 and 124B are selectively formed 371. In either scenario, the Ge—Si layer 130 and any sidewall spacers can then be removed. Ge—Si alloy layer 130 masks first wells 122 from ion implantation with second dopant.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A method for forming self-aligned, doped wells in a semiconductor structure, comprising the steps of:

forming a silicon dioxide-polysilicon-silicon dioxide barrier layer on a surface of a substrate to produce a modified substrate having an outer silicon dioxide layer;

etching the outer silicon dioxide layer of the modified substrate to expose the polysilicon of the barrier layer at selected locations;

forming wells having a first conductivity type at the selected locations;

exposing the modified substrate to a germanium-silicon mixture to deposit a germanium-silicon alloy layer selectively on the exposed polysilicon, said germanium-silicon alloy layer including an outer sidewall, an inner sidewall and an exposed horizontal surface at selected locations;

etching the outer silicon dioxide and polysilicon layers of the barrier layer on the modified substrate at locations adjacent to the deposited germanium-silicon alloy layer;

forming sidewall spacers of a selected thickness on said inner sidewalls of said germanium-silicon alloy layer; and forming wells having a second conductivity type at the etched locations spaced apart at a distance from said wells having a first conductivity type, said distance being substantially equal to the thickness of said sidewall spacers.

2. The method of claim 1, wherein the step of exposing the modified substrate to a germanium-silicon mixture comprises the steps of:

etching the substrate to remove said masking material;

heating the substrate to between 500° C. and 1000° C.; and exposing the etched substrate to a germanium-silicon mixture in the presence of HCl.

3. The method of claim 2, wherein the step of etching the modified substrate comprises etching the outer silicon dioxide and polysilicon layers of the barrier layer.

4. The method of claim 2, wherein the step of forming wells of the second conductivity type comprises implanting the substrate with ions of a second dopant.

5. The method of claim 4, wherein the ion implantation step uses phosphorous ions.

6. The method of claim 1, wherein the step of implanting ions of a first dopant comprises implanting boron ions.

7. A method for forming self-aligned, doped wells in a semiconductor structure, which comprises the steps of:

forming a silicon dioxide-polysilicon-silicon dioxide barrier layer on a surface of the substrate to produce a modified substrate having an outer silicon dioxide layer;

masking the modified substrate with a masking material to define a set of selected locations;

etching the outer silicon dioxide layer of the modified substrate to expose the polysilicon of the barrier layer at the set of selected locations;

forming wells having a first conductivity type at the selected locations;

exposing the modified substrate to a germanium-silicon mixture under conditions selected to deposit a germanium-silicon alloy layer selectively on the exposed polysilicon, said germanium-silicon alloy layer including an outer sidewall, an inner sidewall and an exposed horizontal surface at selected locations;

etching the outer silicon dioxide and polysilicon layers of the barrier layer on the modified substrate at locations adjacent to the deposited germanium-silicon alloy layer;

forming sidewall spacers of a selected thickness on said inner sidewalls of said germanium-silicon alloy layer; and forming wells having a second conductivity type at the etched locations spaced apart at a distance from said wells having a first conductivity type, said distance being substantially equal to the thickness of said sidewall spacers.

8. The method of claim 7, wherein the step of exposing the modified substrate to a germanium-silicon mixture comprises the steps of:

etching the substrate to remove said masking material;

heating the substrate to between 500° C. and 1000° C.; and exposing the etched substrate to a germanium-silicon mixture in the presence of HCl.

9. The method of claim 8, wherein the step of etching the modified substrate comprises etching the outer silicon dioxide and polysilicon layers of the barrier layer.

10. The method of claim 8, wherein the step of forming wells of the second conductivity type comprises implanting the substrate with ions of a second dopant.

11. The method of claim 10, wherein the ion implantation step uses phosphorous ions.

12. The method of claim 7, wherein the step of implanting ions of a first dopant comprises implanting boron ions.

13. The method of claim 7, wherein the silicon dioxide layers of the barrier layer are between about 100 and about 1000 Å thick and the polysilicon layer is between about 50 and 500 Å thick.

14. The method of claim 7, which further includes the steps of:

after etching the outer silicon dioxide and polysilicon layers of the barrier layer, depositing an outer layer of spacer material of a selected thickness onto the inner sidewall and the exposed horizontal surface of the germanium-silicon alloy layer; and etching the outer layer of spacer material on the exposed horizontal surface of the deposited germanium-silicon alloy layer thereby forming said sidewall spacers of a selected thickness on said inner sidewalls of said germanium-silicon alloy layer.

15. The method of claim 7, which further includes the steps of:

masking sidewall spacers to define a set of selected locations wherein wells having first and second conductivity types will be spaced apart at a distance from each other;

prior to forming said wells having a second conductivity type, etching the sidewall spacers which have not been masked and leaving intact said masked sidewall spacers;

removing the masking from said masked sidewall spacers; and forming wells having a second conductivity type adjacent the sidewall spacers locations spaced apart at a distance from said wells having a first conductivity type, said distance being substantially equal to the thickness of said sidewall spacers.

16. The method of claim 9, wherein the step of exposing the modified substrate to a germanium-silicon mixture comprises the steps of:

etching the substrate to remove said masking material;

heating the substrate to between 500° C. and 1000° C.; and exposing the etched substrate to a germanium-silicon mixture in the.presence of HCl.

17. A method for forming self-aligned doped wells in a semiconductor structure which comprises the steps of:

forming a silicon dioxide-polysilicon-silicon dioxide barrier layer on a surface of the substrate to produce a modified substrate having an outer silicon dioxide layer;

etching the outer silicon dioxide layer of the modified substrate to expose the polysilicon of the barrier layer at selected locations;

forming wells having a first conductivity type at the selected locations by implanting the substrate with ions of a first dopant;

exposing the modified substrate to a germanium-silicon mixture under conditions selected to deposit a germanium-silicon alloy layer selectively on the exposed polysilicon, said germanium-silicon alloy layer including an outer sidewall, an inner sidewall and an exposed horizontal surface at selected locations;

etching the outer silicon dioxide and polysilicon layers of the barrier layer on the modified substrate at locations adjacent to the deposited germanium-silicon alloy layer;

forming sidewall spacers of a selected thickness on said inner sidewalls of said germanium-silicon alloy layer; and forming wells having a second conductivity type at the etched locations spaced apart at a distance from said wells having a first conductivity type, said distance being substantially equal to the thickness of said sidewall spacers.

18. The method of claim 17, wherein the step of exposing the modified substrate to a germanium-silicon mixture comprises the steps of:

etching the substrate to remove said masking material;

heating the substrate to between 500° C. and 1000° C.; and exposing the etched substrate to a germanium-silicon mixture in the presence of HCl.

19. The method of claim 18, wherein the step of etching the modified substrate comprises etching the outer silicon dioxide and polysilicon layers of the barrier layer.

20. The method of claim 18, wherein the step of forming wells of the second conductivity type comprises implanting the substrate with ions of a second dopant.

21. The method of claim 20, wherein the ion implantation step uses phosphorous ions.

22. The method of claim 17, wherein the step of implanting ions of a first dopant comprises implanting boron ions.

23. The method of claim 17, wherein the silicon dioxide layers of the barrier layer are between about 100 and about 1000 Å thick and the polysilicon layer is between about 50 and 500 Å thick.

24. The method of claim 17, which further includes the steps of:

after etching the outer silicon dioxide and polysilicon layers of the barrier layer, depositing an outer layer of spacer material of a selected thickness onto the inner sidewall and the exposed horizontal surface of the germanium-silicon alloy layer; and etching the outer layer of spacer material on the exposed horizontal surface of the deposited germanium-silicon alloy layer thereby forming said sidewall spacers of a selected thickness on said inner sidewalls of said germanium-silicon alloy layer.

25. The method of claim 17, which further includes the steps of:

masking sidewall spacers to define a set of selected locations wherein wells having first and second conductivity types will be spaced apart at a distance from each other;

prior to forming said wells having a second conductivity type, etching the sidewall spacers which have not been masked and leaving intact said masked sidewall spacers;

removing the masking from said masked sidewall spacers; and forming wells having a second conductivity type adjacent the spacer sidewall locations spaced apart at a distance from said wells having a first conductivity type, said distance being substantially equal to the thickness of said sidewall spacers.

* * * * *